(12) United States Patent
Tadayon

(10) Patent No.: US 11,817,423 B2
(45) Date of Patent: Nov. 14, 2023

(54) DOUBLE-SIDED SUBSTRATE WITH CAVITIES FOR DIRECT DIE-TO-DIE INTERCONNECT

(71) Applicant: Intel Corporation, Santa Clara, CA (US)

(72) Inventor: Pooya Tadayon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 921 days.

(21) Appl. No.: 16/524,743

(22) Filed: Jul. 29, 2019

(65) Prior Publication Data
US 2021/0035951 A1 Feb. 4, 2021

(51) Int. Cl.
*H01L 25/065* (2023.01)
*H01L 23/13* (2006.01)
*H01L 23/538* (2006.01)

(52) U.S. Cl.
CPC .......... *H01L 25/0657* (2013.01); *H01L 23/13* (2013.01); *H01L 23/5384* (2013.01); *H01L 23/5385* (2013.01); *H01L 23/5386* (2013.01); *H01L 23/5389* (2013.01); *H01L 25/0652* (2013.01); *H01L 2225/06513* (2013.01); *H01L 2225/06517* (2013.01); *H01L 2225/06548* (2013.01); *H01L 2225/06558* (2013.01); *H01L 2225/06589* (2013.01)

(58) Field of Classification Search
CPC . H01L 25/0657; H01L 23/13; H01L 23/5384; H01L 23/5385; H01L 23/5386; H01L 23/5389; H01L 25/0652; H01L 2225/06513; H01L 2225/06517; H01L 2225/06548; H01L 2225/06558; H01L 2225/06589
See application file for complete search history.

(56) References Cited

U.S. PATENT DOCUMENTS

| | | | |
|---|---|---|---|
| 9,379,090 B1 * | 6/2016 | Syed | H01L 23/13 |
| 10,535,608 B1 * | 1/2020 | Rubin | H01L 24/17 |
| 2006/0081967 A1 * | 4/2006 | Ha | H01L 24/49 257/676 |
| 2019/0067245 A1 * | 2/2019 | Kinsley | H01L 23/49503 |
| 2020/0212012 A1 * | 7/2020 | Meyers | H01L 21/561 |
| 2020/0227401 A1 * | 7/2020 | Elsherbini | H01L 24/83 |

* cited by examiner

*Primary Examiner* — Fernando L Toledo
*Assistant Examiner* — Neil R Prasad
(74) *Attorney, Agent, or Firm* — Schwabe, Williamson & Wyatt, P.C.

(57) ABSTRACT

Embodiments include a package substrate and semiconductor packages. A package substrate includes a first cavity in a top surface, first conductive pads on a first surface of the first cavity, a second cavity in a bottom surface, second conductive pads on a second surface of the second cavity, where the first surface is above the second surface, and a third cavity in the first and second cavities, where the third cavity vertically extends from the top surface to the bottom surface. The third cavity overlaps a first portion of the first cavity and a second portion of the second cavity. The package substrate may include conductive lines coupled to the first and second conductive pads, a first die in the first cavity, a second die in the second cavity, and interconnects in the third cavity that directly couple first die to the second die.

25 Claims, 12 Drawing Sheets

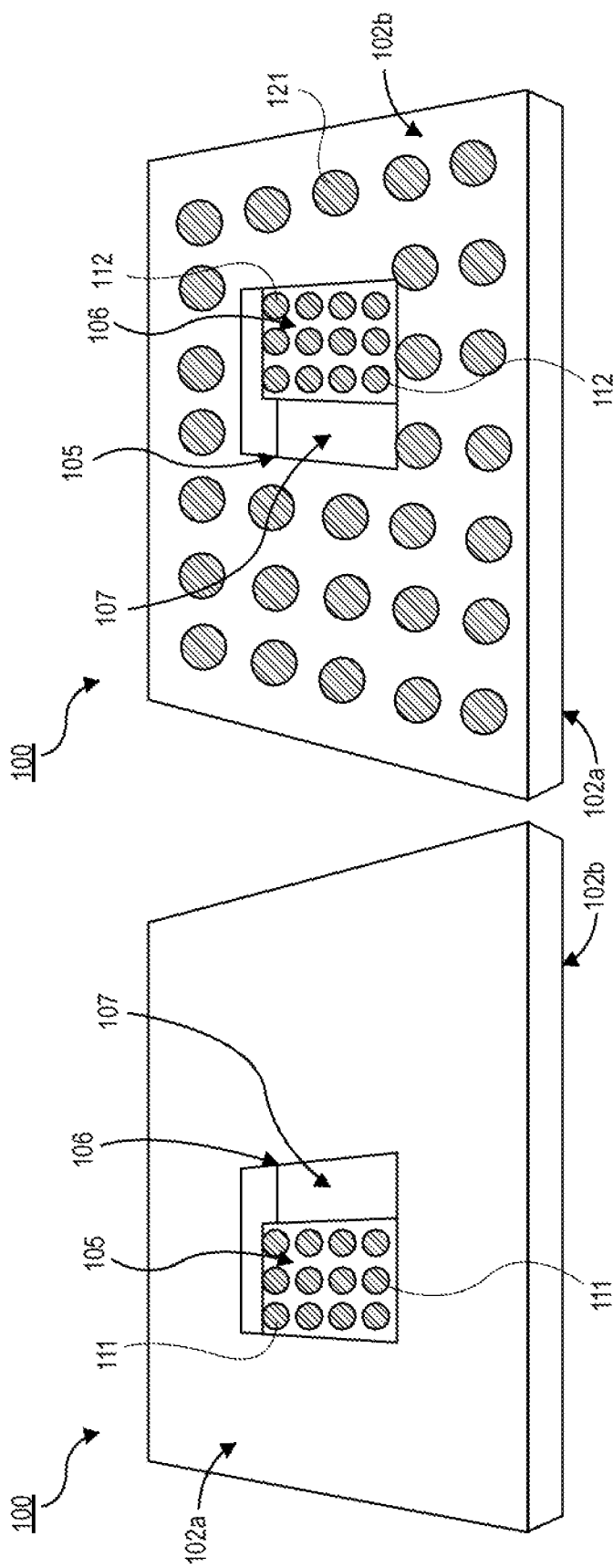

DOUBLE-SIDED SUBSTRATE WITH CAVITIES FOR DIRECT DIE-TO-DIE INTERCONNECT

FIELD

Embodiments relate to packaging semiconductor devices. More particularly, the embodiments relate to semiconductor devices with double-sided package substrates with a cavity for direct die-to-die interconnects.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as with die-to-die interconnects, while optimizing the performance of each device, however is not without issue.

Die-to-die interconnects are critical components for multi-chip packages (MCPs). MCPs typically require high bandwidth memory (HBM), where such MCPs are thermally limited due to thermal cross-talk between the processor and the HBM stack as a result of the proximity between these respective components. For example, the close proximity between the HBM stack and the processor (or the system-on-chip (SOC)) generally leads to increased thermal cross-talk and a degradation in performance as the processor and/or the HBM stack need to operate at a lower power envelope.

Furthermore, as existing technologies attempt to solve these thermal cross-talk issues, these attempted packaging solutions continue to lead to further challenges and/or issues while only providing minimal (or incremental) improvements. Some of these packaging solutions include slotted integrated heat spreaders (IHS), composite IHS, thermal interface materials (TIMs), or the like. While these solutions may offer incremental improvements, the main issue still remains that the neighboring silicon (and such features in ICs) are too close in proximity to each other and thus need to share the same thermal solution.

Another issue involved with die-to-die interconnects of MCPs is that the bandwidth of the connections between the HBMs and the processors are dependent on the distance of these connections. In existing technologies, such connection is typically several millimeters long and routed through a bridge or an interposer, which further limits the bandwidth, the signal integrity, and the integrity of the electrical connections.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIGS. 1A-1B are illustrations of perspective views of a double-sided package substrate with a first cavity in a top surface, a second cavity in a bottom surface, and a third cavity in between the first and second cavities, according to one embodiment.

DETAILED DESCRIPTION

Figure 2A:
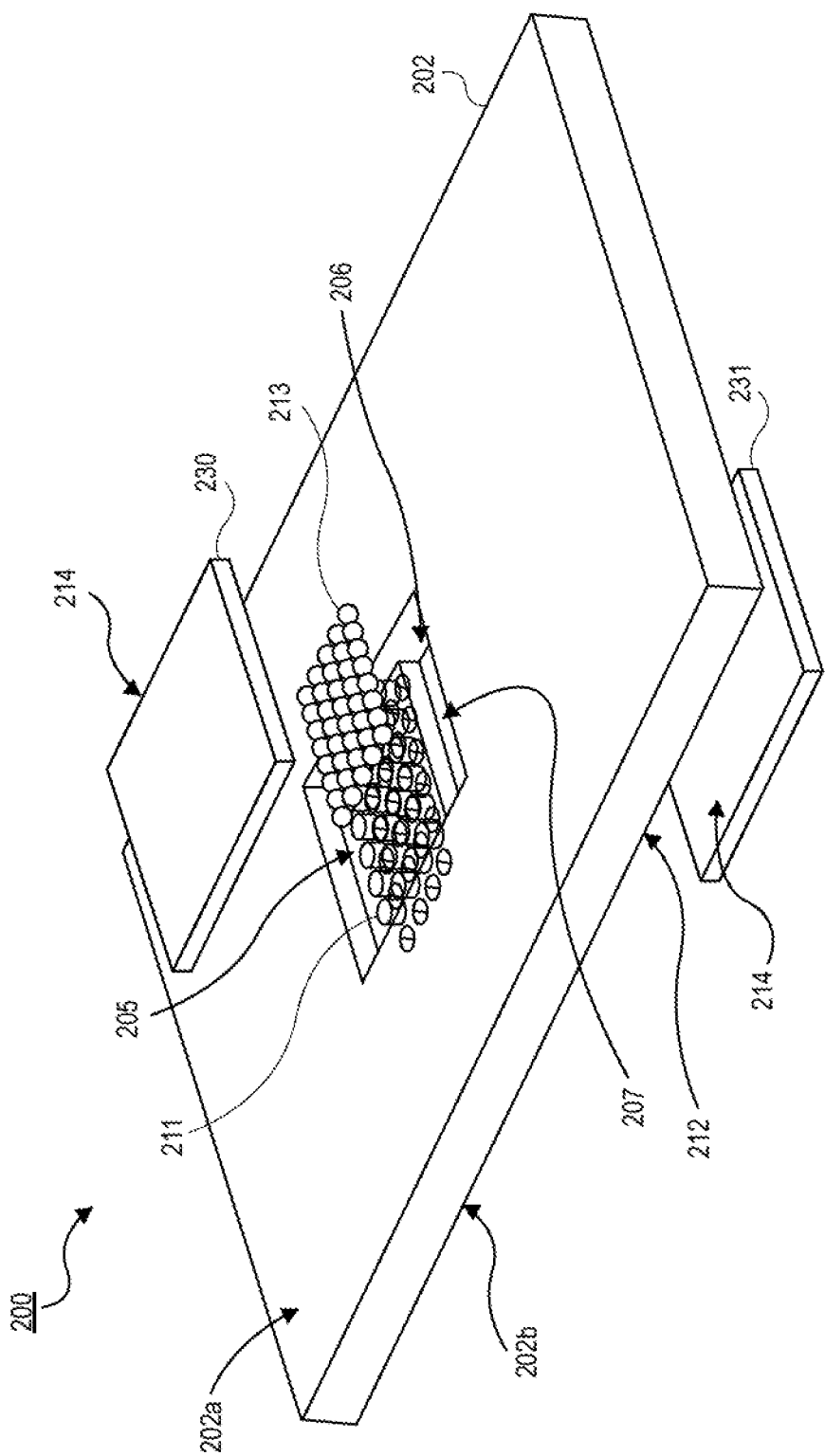
FIG. 2A is an illustration of a perspective view of a semiconductor package with a plurality of dies, a direct die-to-die interconnect, and a double-sided package substrate with a first cavity in a top surface, a second cavity in a bottom surface, and a third cavity in between the first and second cavities, prior to assembly of the semiconductor package, according to one embodiment.

Described herein are semiconductor devices with double-sided package substrates with cavities on both sides for direct die-to-die interconnects and methods of forming such semiconductor devices. The semiconductor devices described below and methods of forming such semiconductor devices may include a package substrate (or the double-side package substrate) with a first cavity in a top surface, a second cavity in a bottom surface, and a third cavity (or a cut-out region/portion) in between (or overlapping) the first and second cavities, according to one embodiment. The embodiments described herein include implementing the first and second cavities (or cut-outs on both the top and bottom surfaces) of the package substrate to directly couple a first die (or a top die) to a second die (or a bottom die) through the third cavity with direct die interconnects (or die-to-die controlled collapse chip connection (C4) interconnects).

The embodiments described herein provide improvements to existing packaging solutions by enabling the first die (e.g., the processor, the system-on-chip (SOC), etc.) to be directly disposed into (or coupled to) the top of the package substrate, while the second die (e.g., the high bandwidth memory (HBM), the HBM stack, etc.) is directly disposed into the bottom of the package substrate, thereby allowing the first and second dies to be conductively coupled with direct die-to-die interconnects, and to also have independent thermal solutions (e.g., integrated heat spreaders (IHSs), etc.) for each of the first and second dies. Implementing independent thermal solutions for each die thus eliminates the cross-talk issues described above. These embodiments also improve packaging solutions by reducing the overall z-height of the semiconductor packages by embedding and conductively coupling the dies into the package substrate with the direct die-to-die interconnects. Furthermore, such direct configuration of the die-to-die interconnects through the overlapping cavities of the package substrate (i) substantially reduces the distance (or length) between the dies to nearly/approximately zero, (ii) allows for higher bandwidth, (iii) improves the timing budget margin, and (iv) thus enables improved signal integrity and higher speeds.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with dies, direct die-to-die interconnects, and package substrates, where the package substrates have first cavities in the top surface, second cavities in the bottom surface, and third cavities in between (or overlapping) the first and second cavities.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIGS. 1A-1B are illustrations of perspective views of a package substrate 100, according to one embodiment. In particular, the package substrate 100 may be a double-sided package substrate with a first cavity 105 (or a top cavity) in a top surface 102a, a second cavity 106 (or a bottom cavity) in a bottom surface 102b, and a third cavity 107 in between (or overlapping) the first and second cavities 105-106, according to one embodiment. Note that, in some embodiments, the package substrate 100 may have one top cavity 105 and one bottom cavity 106, while, in other embodiments, such package substrate 100 may have more than one top cavity and/or one bottom cavity such as two bottom cavities (e.g., as shown with the two bottom cavities 606a-b of FIG. 6). Also, note that, for illustrative simplicity, the bottom cavity 106 in FIG. 1A is below (or on the opposite side of) the package substrate 100, and the top cavity 105 in FIG. 1B is above (or on the opposite side of) the package substrate 100, while the third cavity in FIGS. 1A-1B overlaps portions of the first and second cavities 105-106.

As illustrated in FIG. 1A, the top surface 102a of the package substrate 100 with the top cavity 105 is shown, in accordance with an embodiment. Similarly, as illustrated in FIG. 1B, the bottom surface 102b of the package substrate 100 with the bottom cavity 106 is shown, where the third cavity 107 extends from the top surface 102a to the bottom surface 102b, and where the opening of the third cavity 107 overlaps a portion of the opening of the first cavity 105 and a portion of the opening of the second cavity 106, in accordance with an embodiment.

Referring now to FIG. 1A, a perspective illustration of a top view of a package substrate 100 is shown, in accordance with an embodiment. In an embodiment, a first cavity 105 may be disposed into a top surface 102a of the package substrate 100. For one embodiment, the first cavity 105 may be patterned as a top opening in the top surface 102a of the package substrate 100, where the top opening may have a footprint (or an x-y area) that may fit (or be equal to or greater than) the footprint of a top die (e.g., the first die 230 of FIG. 2A).

In some embodiments, a plurality of first conductive pads 111 may be disposed in the first cavity 105. The first conductive pads 111 may be an array of metallic pads (or the like) disposed on a surface of the first cavity 105, where the first conductive pads 111 may be conductively coupled to the top die as C4 connection pads (as shown below in FIGS. 2A-2C). In some embodiments, the first conductive pads 111 may be implemented as interconnect structures (or connections) that may variously comprise an alloy of nickel, palladium, and tin (and, in some embodiments, copper), and/or any combination thereof.

Furthermore, as shown in FIG. 1A, a third cavity 107 may be disposed in the package substrate 100. In some embodiments, the third cavity 107 may have an opening with a thickness (or a z-height) that extends from the top surface 102a to the bottom surface 102b of the package substrate 100. For one embodiment, the opening of the third cavity 107 overlaps a portion of the top opening of the first cavity 105 and a portion of a bottom opening of the second cavity 106 (as shown in FIG. 1B), where such portion of the first cavity 105 does not have the first conductive pads 111, and where such portion may be implemented to subsequently couple the top die directly with a bottom die using die-to-die interconnects (e.g., as shown with the first die 230, the second die 231, and the plurality of interconnects 213 of FIGS. 2A-2C). For example, in some embodiments, these direct die-to-die interconnects (e.g., as shown with the interconnects 213 of FIGS. 2A-2C) may be a plurality of conductive interconnects directly that are disposed between the top and bottom dies, and vertically extending through the third cavity, where such interconnects may conductively couple the top die to the bottom die, and thus implementing (or forming) a path link between the top and bottom dies that has a length of approximately zero.

For one embodiment, the package substrate 100 may include, but is not limited to, a package, a substrate, a printed circuit board (PCB), and a motherboard. For one embodiment, the package substrate 100 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer may be a photosensitive dielectric layer. For one embodiment, the PCB 100 may include a plurality of conductive layers, which may further include copper (or metallic) traces, lines, pads (e.g., the plurality of first conductive pads 111, the plurality of second conductive pads 112 of FIG. 1B, the plurality of third conductive pads 121 of FIG. 1B, etc.), vias, via pads, holes, and/or planes. In some embodiments, the conductive pads 111, 112, and 121 may be ball grid array (BGA) balls.

Referring now to FIG. 1B, a perspective illustration of a bottom view of the respective package substrate 100 is shown, in accordance with an embodiment. In an embodiment, a second cavity 106 may be disposed into a bottom surface 102b of the package substrate 100. For one embodiment, the second cavity 106 may be patterned as a bottom opening in the bottom surface 102b of the package substrate 100, where the bottom opening may have a footprint that may fit (or be equal to or greater than) the footprint of a bottom die (e.g., the second die 231 of FIG. 2A).

In some embodiments, a plurality of second conductive pads 112 may be disposed in the second cavity 106. The second conductive pads 112 may be an array of metallic pads (or the like) or microballs disposed on a surface of the second cavity 106, where the second conductive pads 112 may be conductively coupled to the bottom die as C4 connection pads (as shown below in FIGS. 2A-2C). In some embodiments, the second conductive pads 112 may be implemented as interconnect structures (or connections) that may variously comprise an alloy of nickel, palladium, and tin (and, in some embodiments, copper), and/or any combination thereof.

Furthermore, as shown in FIG. 1B, the third cavity 107 may be disposed in the package substrate 100. In some embodiments, the third cavity 107 may have an opening with a thickness that extends from the top surface 102a to the bottom surface 102b of the package substrate 100. For one embodiment, the opening of the third cavity 107 overlaps the portion of the top opening of the first cavity 105 (as shown in FIG. 1A) and the portion of the bottom opening of the second cavity 106, where such portion of the second cavity 106 does not have the second conductive pads 112, and where such portion may be implemented to subsequently couple the bottom die directly with the top die using the die-to-die interconnects (e.g., as shown with the first die 230, the second die 231, and the plurality of interconnects 213 of FIGS. 2A-2C).

For one embodiment, a plurality of third conductive pads 121 may be disposed on the bottom surface 102b of the package substrate 100. The third conductive pads 121 may include a ball grid array (BGA) package, a land grid array (LGA) package, a pin grid array (PGA) package, and/or the like. Although some embodiments are not limited in this regard, the package substrate 100 may in turn be coupled to another body, for example, a substrate such as a computer motherboard. Connections between the package substrate 100 and another body may be made using any suitable structure, such as solder bumps or the like. Additionally, in some embodiments, the package substrate 100 may include a variety of electronic structures formed thereon or therein. For one embodiment, one or more different materials may be used for forming the package substrate 100. In certain embodiments, the package substrate 100 is an organic substrate made up of one or more layers of polymer base material, with conducting regions for transmitting signals.

Note that the package substrate 100 of FIGS. 1A-1B may include fewer or additional packaging components based on the desired packaging design.

Figure 2B:
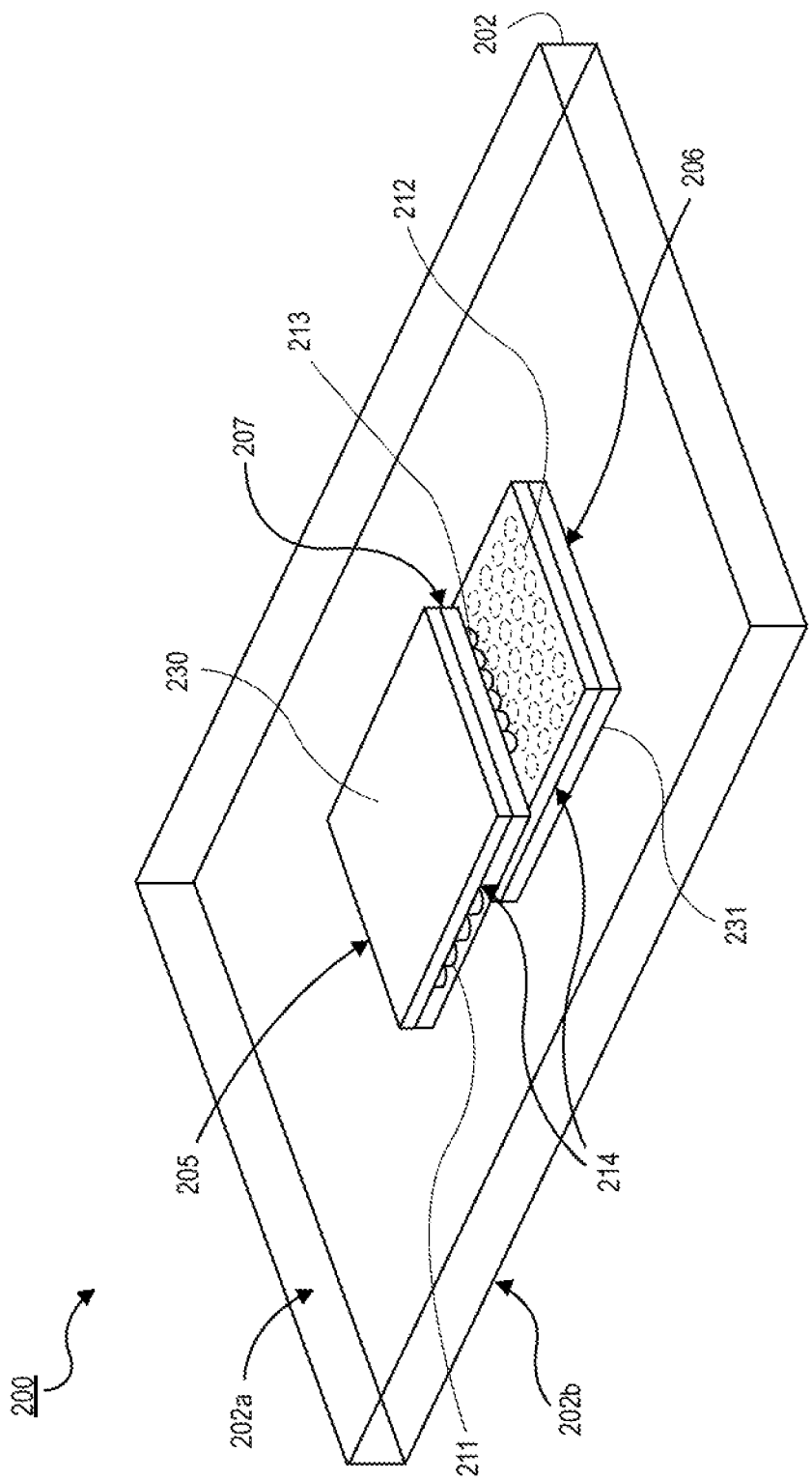
FIG. 2B is an illustration of a perspective view of a semiconductor package with a plurality of dies, a direct die-to-die interconnect, and a double-sided package substrate with a first cavity in a top surface, a second cavity in a bottom surface, and a third cavity in between the first and second cavities, after the assembly of the semiconductor package, according to one embodiment.
Figure 2C:
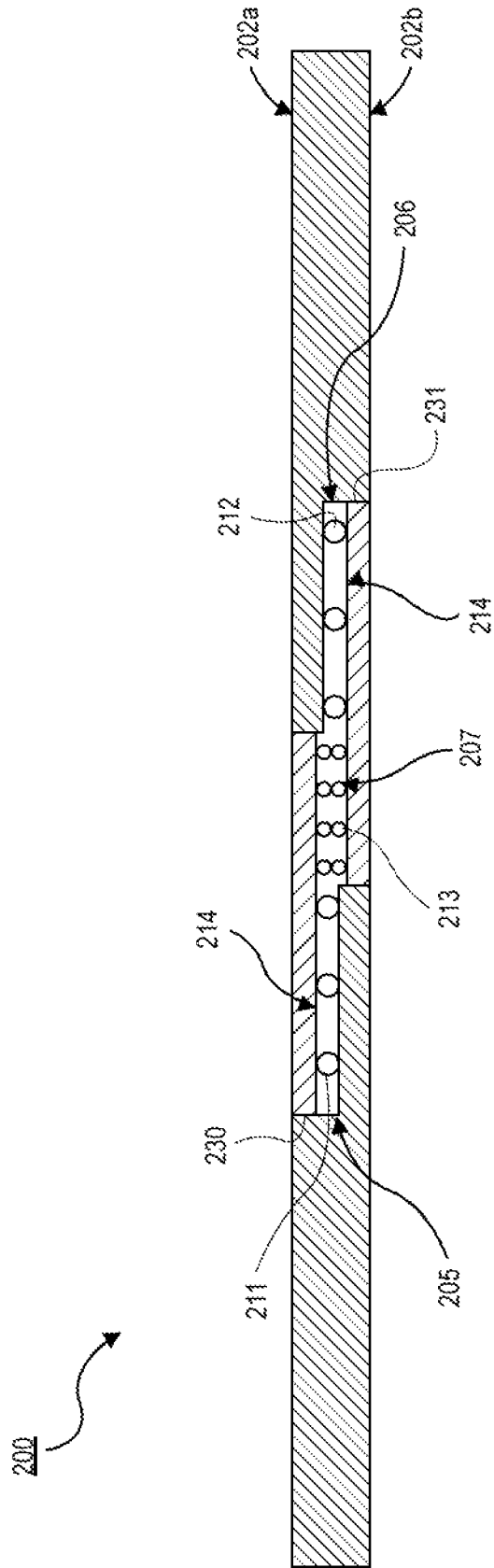
FIG. 2C is an illustration of a cross-sectional view of a semiconductor package with a plurality of dies, a direct die-to-die interconnect, and a double-sided package substrate with a first cavity in a top surface, a second cavity in a bottom surface, and a third cavity in between the first and second cavities, after the assembly of the semiconductor package, according to one embodiment.

FIGS. 2A-2C are illustrations of perspective and cross-sectional views of a semiconductor package 200 with a plurality of dies 230-231, a package substrate 202, a plurality of cavities 205-207, and a plurality of interconnects 213, according to some embodiments. For one embodiment, the semiconductor package 200 may include a BGA package, a LGA package, a PGA package, and/or any similar package. FIG. 2A is an illustration of a perspective view of the semiconductor package 200 prior to assembly, while FIGS. 2B-2C are illustrations of perspective and cross-sectional views of the respective semiconductor package 200 after the assembly. The package substrate 202 of the semiconductor package 200 of FIGS. 2A-2C is substantially similar to the package substrate 100 described above in FIGS. 1A-1B. Likewise, the components of the package substrate 202 are substantially similar to the components of the package substrate 100 described above in FIGS. 1A-1B. Note that the semiconductor package 200 is not limited to the illustrated semiconductor packaged system, and thus may be designed/formed with fewer, alternate, or additional packaging components and/or with different interconnecting structures.

Referring now to FIG. 2A, a perspective illustration of a semiconductor package 200 is shown prior to assembly, in accordance with an embodiment. In an embodiment, the semiconductor package 200 may include a plurality of dies 230-231, a package substrate 202, a plurality of cavities 205-207, and a plurality of interconnects 213. As shown in FIG. 2A, the package substrate 202 may be a double-sided package substrate having a first cavity 205 in a top surface 202a, a second cavity 206 in a bottom surface 202b, and a third cavity 207 in between the first and second cavities 205-206, according to one embodiment. Furthermore, in some embodiments, a first die 230 may be disposed into the first cavity 205, and a second die 231 may be disposed into the second cavity 206, where the interconnects 213 may be disposed into the third cavity 207 to directly coupled the first die 230 to the second die 231.

According to an embodiment, the first die 230 may be coupled in/into the first cavity 205 of the package substrate 202 via a plurality of solder bumps 214 (or solder joints, microbumps, microballs, etc.) that may be disposed on a bottom surface of the first die 230. Note that a solder joint formed by soldering of a microbump may itself be referred to as a "bump," a "solder bump," and/or a "microbump." Likewise, the second die 231 may be coupled into the second cavity 206 of the package substrate 202 via the solder bumps 214 that may be disposed on a bottom surface of the second die 231.

Additionally, in an embodiment, a plurality of first conductive pads 211 may be disposed in the first cavity 205 and subsequently coupled to the solder bumps 214 of the first die 230 (e.g., as shown below in FIGS. 2B-2C). Likewise, a plurality of second conductive pads 212 may be disposed in the second cavity 206 and subsequently coupled to the solder bumps 214 of the second die 231 (e.g., as shown below in FIGS. 2B-2C). Furthermore, as described above, the first and second conductive pads 211-212 may be metallic pads (or the like) disposed on the respective surfaces of the first and second cavities 205-206, where the first and second conductive pads 211-212 may be conductively coupled to the respective first and second dies 230-231 as C4 connection pads. The first and second conductive pads 211-212 may be substantially similar to the first and second conductive pads 111-112 described above in FIGS. 1A-1B.

Furthermore, as shown in FIG. 2A, the third cavity 207 may have an opening with a thickness that extends from the top surface 202a to the bottom surface 202b of the package substrate 200. For one embodiment, the opening of the third cavity 207 overlaps a portion of the top opening of the first cavity 205 and a portion of a bottom opening of the second cavity 206, where such portions of the first and second cavities 205-206 do not have conductive pads, and as such the interconnects 213 may be disposed into these overlapping open portions of the first and second cavities 205-206 to implement (or form) direct die-to-die interconnects between the first and second dies 230-231.

For example, in some embodiments, the interconnects 213 may be a plurality of conductive interconnects (or metallic, such as copper or solder) that are directly disposed between the first and second dies 230-231. In these embodiments, the interconnects 213 may be disposed into the open portions of the first and second cavities 205-206, and may vertically extend through the third cavity 207, where the interconnects 213 may conductively couple the first die 230 to the second die 231, and may have a path link between the first and second dies 230-231 that has a length of approximately zero.

For one embodiment, the first and second dies 230-231 may include, but are not limited to, a semiconductor die, an electronic device (e.g., a wireless device), an integrated circuit (IC), a central processing unit (CPU), a microprocessor, a platform controller hub (PCH), a memory (e.g., a HBM, a HBM stack, etc.), and/or a field-programmable gate array (FPGA). The first and second dies 230-231 may be formed from a material such as silicon and have circuitry thereon that is to be coupled to the package substrate 200.

Referring now to FIG. 2B, a perspective illustration of the respective semiconductor package 200 is shown after the assembly, in accordance with an embodiment. As shown in FIG. 2B, to assemble the semiconductor package 200, the first and second dies 230-231 may be respectively stacked into the respective first and second cavities 205-206 of the package substrate 200, where the stacked first and second dies 230-231 are directly coupled via the interconnects 213 that are vertically disposed within the third cavity 207.

According to an embodiment, the first die 230 may be coupled onto the first cavity 205 via the solder bumps 214, where the solder bumps 214 of the first die 230 may be conductively coupled to the first conductive pads 211. Likewise, in one embodiment, the second die 231 may be coupled onto the second cavity 206 via the solder bumps 214, where the solder bumps 214 of the second die 231 may be conductively coupled to the second conductive pads 212. Note that the second conductive pads 212 (as shown with dashed lines) are shown for illustrative purposes/simplicity, even when in the assembled state the second conductive pads 212 are not visible from the top-perspective view as shown in FIG. 2B.

Referring now to FIG. 2C, a cross-sectional illustration of the respective semiconductor package 200 is shown after the assembly, in accordance with an embodiment. As shown in FIG. 2C, the first and second dies 230-231 may be respectively stacked into the respective first and second cavities 205-206 of the package substrate 200, where the stacked first and second dies 230-231 are directly coupled via the interconnects 213 that are vertically disposed within the third cavity 207.

In one embodiment, the first die 230 may have a top surface that is substantially coplanar to the top surface 202a of the package substrate 200. In an alternate embodiment, the first die 230 may have a top surface that is above the top surface 202a of the package substrate 200 (i.e., the first die 230 may have a thickness that is greater than a thickness of the first cavity 205). Likewise, in one embodiment, the second die 231 may have a top surface that is substantially coplanar to the bottom surface 202b of the package substrate 200. In an alternate embodiment, the second die 231 may have a top surface that is below the bottom surface 202b of the package substrate 200 (i.e., the second die 231 may have a thickness that is greater than a thickness of the second cavity 206). For another embodiment, the first die 230 (and/or the second die 231) may be flush with the edge of the first cavity 205 (and/or the respective second cavity 206), or the first die 230 (and/or the second die 231) may have a gap between the adjacent edges of the first die 230 and the first cavity 205 (and/or a gap between the respective adjacent edges of the second die 231 and the second cavity 206). Also, note that, in some embodiments, the first die 230 may have a thickness that is substantially equal to a thickness of the second die 231. In other embodiments, the first die 230 may have a thickness that is different than a thickness of the second die 231 (i.e., the first cavity 205 may have a thickness that is substantially equal (and/or different than) a thickness of the second cavity 206).

Note that the semiconductor package 200 of FIGS. 2A-2C may include fewer or additional packaging components based on the desired packaging design.

FIGS. 3A-3D are illustrations of perspective views of a process flow to form a semiconductor package 300 with a plurality of dies 330-331, a plurality of interconnects 313, and a package substrate 302, where the package substrate 302 includes a plurality of cavities 305-307 and a plurality of conductive pads 311-312 and 321, according to some embodiments. The process flow illustrated in FIGS. 3A-3D forms the semiconductor package 300 that is substantially similar to the semiconductor package 200 described above in FIGS. 2A-2C. Likewise, the components of the semiconductor package 300 are substantially similar to the components of the semiconductor package 200 described above in FIGS. 2A-2C. In particular, the package substrate 302 may be substantially similar to the package substrates 100 and 202 described above in FIGS. 1A-1B and 2A-2C. Accordingly, as described above, the process flow of the package substrate 300 illustrates one of the approaches to implement a package substrate with cavities (or cut-outs) on both surfaces/sides and with a cavity window (or opening) in the portion (or region) where the cavities overlap, thereby enabling top/bottom dies to be conductively coupled to each through via C4 interconnects that extend through the cavity window.

Figure 3A:
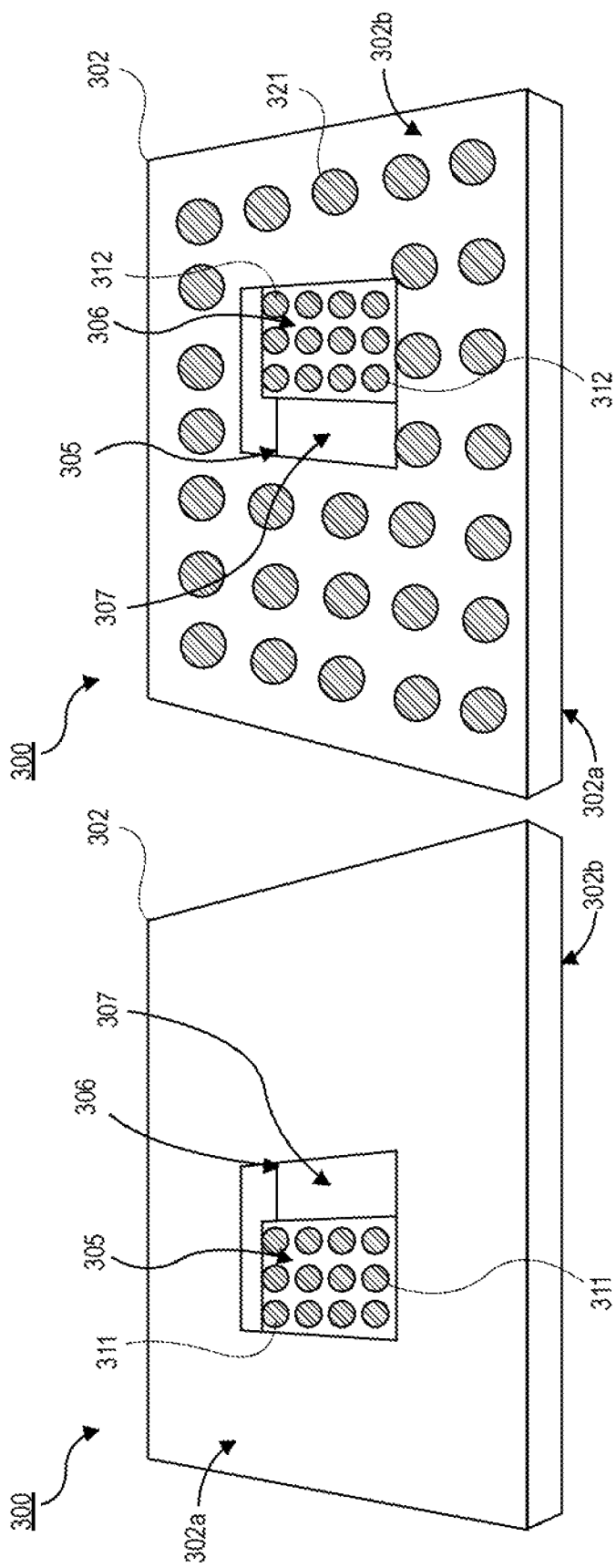
FIGS. 3A-3D are illustrations of perspective views of a process flow to form a semiconductor package with a plurality of dies, a direct die-to-die interconnect, and a double-sided package substrate with a first cavity in a top surface, a second cavity in a bottom surface, and a third cavity in between the first and second cavities, according to one embodiment.

Referring now to FIG. 3A, a perspective illustration of a semiconductor package 300 with a package substrate 302 is shown, in accordance with an embodiment. In an embodiment, as shown with the top and bottom views of the semiconductor package 300, the package substrate 302 may include a first cavity 305 in a top surface 302a, a second cavity 306 in a bottom surface 302b, and a third cavity 307 in between the first and second cavities 305-306. As described above, the first conductive pads 311, the second conductive pads 312, the interconnects 313, and the third conductive pads 321 of the package substrate 302 is substantially similar to the first conductive pads 211, the second conductive pads 212, the interconnects 213, and the third conductive pads 221 of the package substrate 202 described above in FIGS. 2A-2C.

Figure 3B:
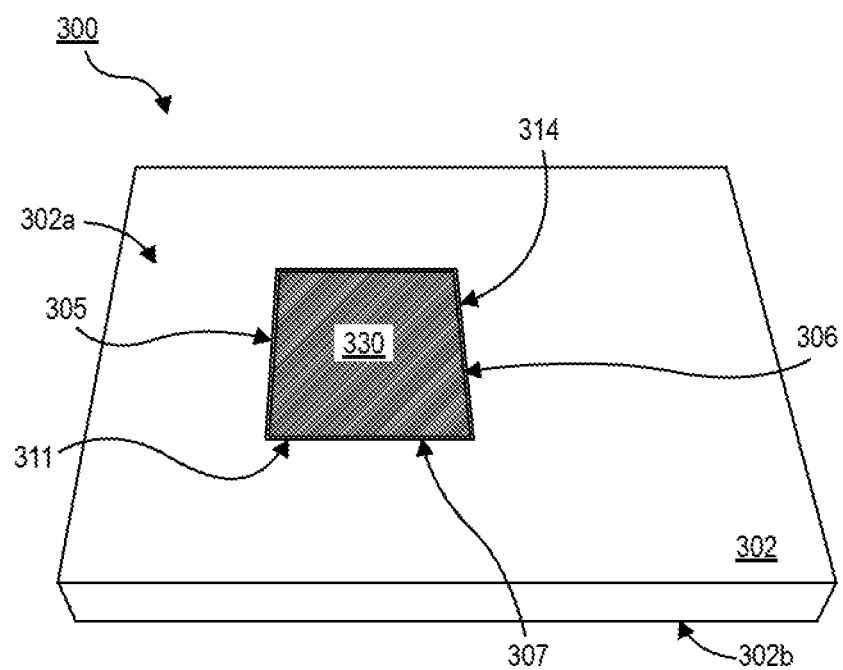

Referring now to FIG. 3B, a top perspective illustration of a semiconductor package 300 with package substrate 302 is shown, in accordance with an embodiment. In an embodiment, as shown with a top view of the package substrate 302, a first die 330 may be disposed into the first cavity 305 of the top surface 302a of the package substrate 302. The first die 330 may have a plurality of solder balls 314 directly over and coupled onto the first conductive pads 311 of the first cavity 305, where a portion of the solder bumps 314 are conductively coupled to the first conductive pads 311 and covered by the first cavity 305, and where the remaining portion of the solder bumps 314 are not covered by the first cavity and remain exposed by the third cavity.

Figure 3C:
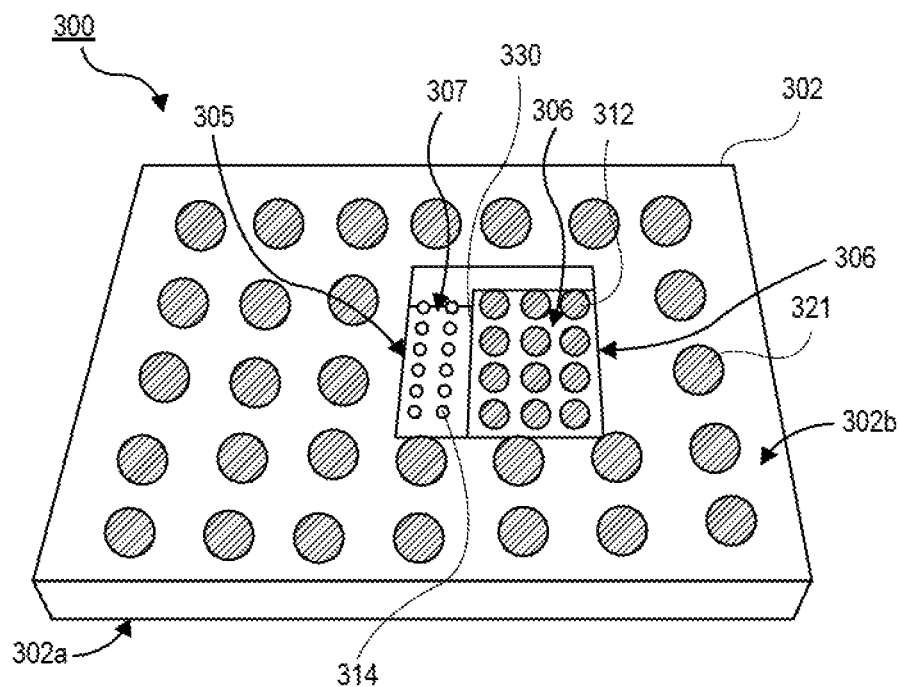
Figure 3D:
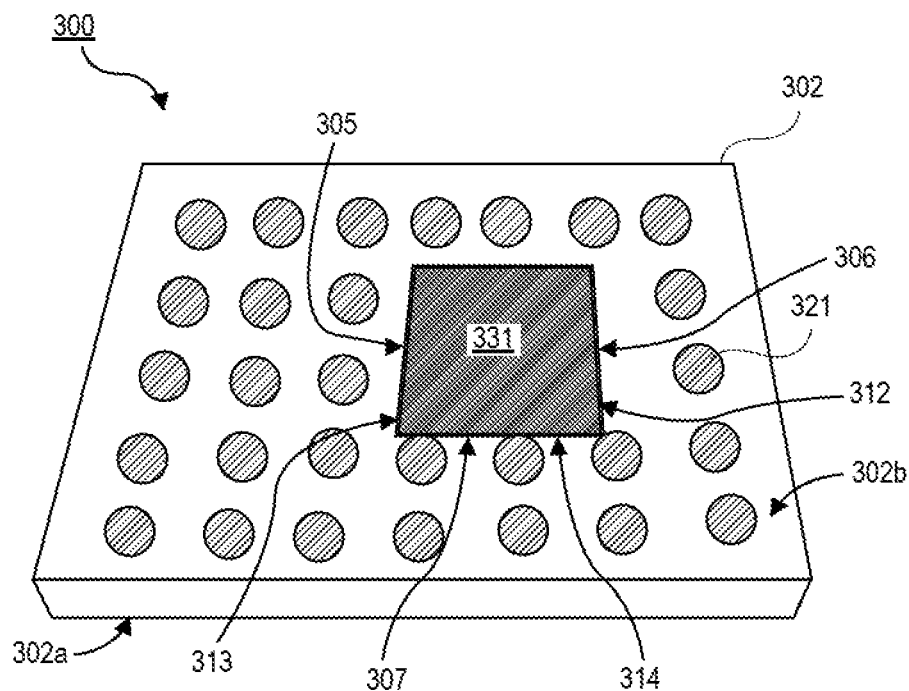

Referring now to FIGS. 3C-3D, a bottom perspective illustration of a semiconductor package 300 with a package substrate 302 is shown, in accordance with an embodiment. In an embodiment, as shown with a bottom view of the package substrate 302, the first die 330 is disposed into the first cavity 305 of the top surface 302a of the package substrate 302. Likewise, as described above, the first die 330 has solder balls 314 directly over the first cavity 305, where a portion of the solder bumps 314 are conductively coupled and covered with the first cavity 305, and where the remaining portion of the solder bumps 314 are not covered by the first cavity 305 and remain exposed with the third cavity 307 (and overlapped and exposed with the second cavity 306).

Additionally, as shown with the bottom view of the package substrate 302, a plurality of third conductive pads 321 are disposed on the bottom surface 302b of the package substrate 302. In one embodiment, a plurality of second conductive pads 312 are disposed on the second cavity 306. Accordingly, the second cavity 306 has the second conductive pads 312 and the exposed solder balls 314 of the first die 330 to be subsequently and directly coupled to a second die 331 as shown with FIG. 3D. That is, according to one embodiment, the second die 331 may be disposed into the second cavity 306, where the second die 331 has solder balls 314 directly coupled to the second conductive pads 312 of the second cavity 306 and the exposed solder balls 314 of the first die 330. In some embodiments, a plurality of interconnects 313 may be disposed into the third cavity 307 to directly couple the exposed solder balls 314 of the second die 331 to the exposed solder balls 314 of the first die 330.

Note that the semiconductor package 300 of FIGS. 3A-3D may include fewer or additional packaging components based on the desired packaging design.

Figure 4:
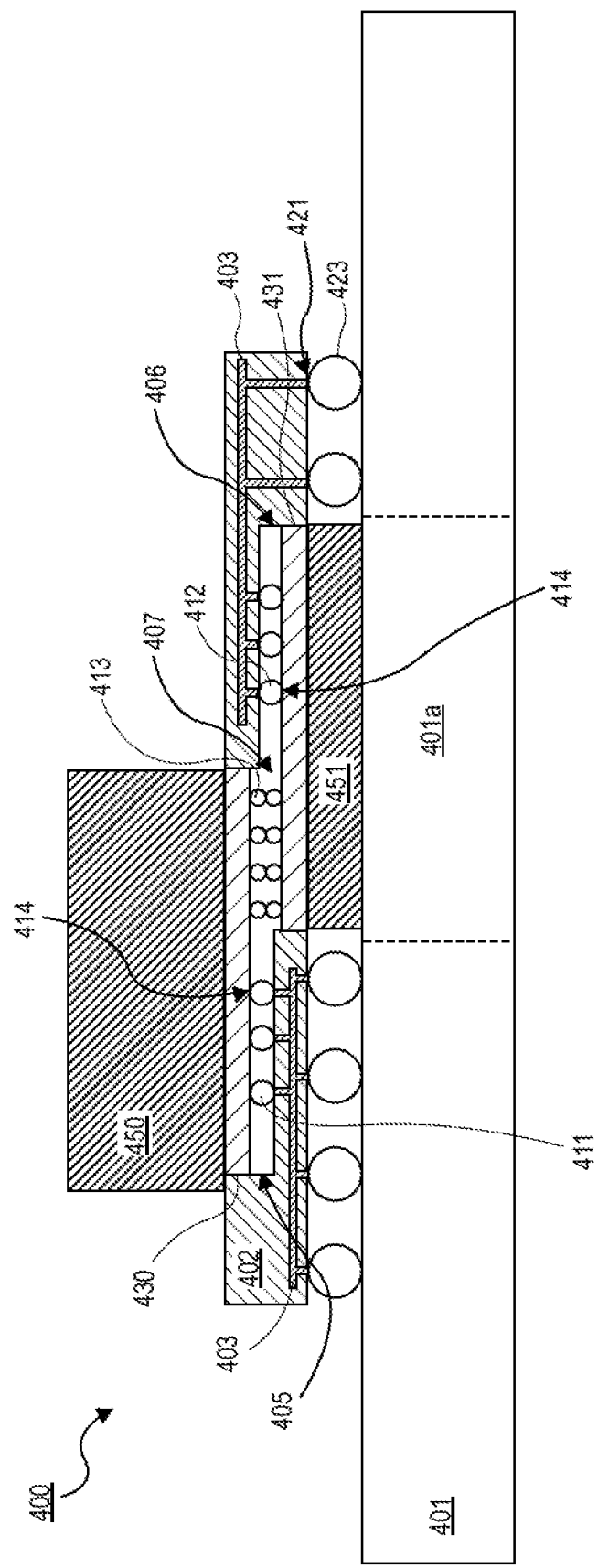
FIG. 4 is an illustration of a cross-sectional view of a semiconductor package with a substrate, a plurality of integrated heat spreaders (IHSs), a plurality of dies, a direct die-to-die interconnect, and a double-sided package substrate, where the double-side package substrate has a first cavity in a top surface, a second cavity in a bottom surface, and a third cavity in between the first and second cavities, according to one embodiment.

Referring now to FIG. 4, a cross-sectional illustration of a semiconductor package 400 is shown, in accordance with an embodiment. The semiconductor package 400 may be substantially similar to the semiconductor package 200 described above in FIGS. 2A-2C, with the exception that a plurality of first and second thermal solutions/devices (e.g., integrated heat spreader (IHS), heat spreader, low profile heat sink, vapor chamber, etc.) 450-451 are disposed on the top surfaces of the respective first and second dies 430-431, and that the package substrate 402 is disposed and coupled onto a substrate 401 (e.g., a PCB, a motherboard, etc.).

Accordingly, as shown in FIG. 4, the first thermal solution 450 may be disposed over the top surfaces of the first die 430 and/or the package substrate 402, while the second thermal solution 451 may be disposed over the top surface of the second die 431 and/or the bottom surface of the package substrate 402. For example, the first and second dies 430-431 may implement the first and second thermal solutions 450-451 as independent thermal solutions (or thermal dissipating devices/components) for each of the respective first and second dies 430-431. In these embodiments, the first and second thermal solutions 450-451 may include any thermal devices used to dissipate heat away from the respective first and second dies 430-431, where such thermal devices may include heat sinks, heat spreaders, cold plates, and/or the like.

In one embodiment, the second die 431 disposed on the bottom surface of the package substrate 402 may be accommodated with the second thermal solution 451, where the second thermal solution 451 may be a low-profile thermal solution/device such as a cold plate or the like. That is, in one embodiment, the second thermal solution 451 may have a thickness that is less than a thickness between the bottom surface of the package substrate 402 and the top surface of the substrate 401. Alternatively, in another embodiment, the substrate 401 may have a cavity 401a (or a cut-out portion/region) that may be optionally patterned into the substrate 401 to accommodate a thermal solution with a larger thickness (or z-height) and/or a larger footprint if desired. However, in some embodiments when the cavity 401a may not be implemented, an additional substrate, such as a stand-off passive interposer, may be inserted between the stack of the package substrate 402 and the substrate 401 to provide a larger z-height gap that may accommodate the desired thermal solution (e.g., as shown below with the interposer 540 of FIG. 5).

As described above, the components of the semiconductor package 400 are substantially similar to the components of the semiconductor package 200 described above in FIGS. 2A-2C. In particular, the package substrate 402 may be substantially similar to the package substrates 102 and 202 described above in FIGS. 1A-1B and 2A-2C. As such, as described above, the package substrate 402 includes a plurality of cavities 405-407 and a plurality of third conductive pads 421. Furthermore, as shown in FIG. 4, the package substrate 402 includes a plurality of conductive lines 403 that conductively couple the first and second dies 430-431 to the substrate 401, where the first and second dies 430-431 have a plurality of solder balls 414 that are directly coupled to the respective first and second conductive pads 411-412, and where the conductive lines 403 further couple the third conductive pads 421 on the bottom surface of the package substrate 402 to a plurality of solder balls 423 that are disposed on the top surface of the substrate 401.

Note that the semiconductor package 400 may include fewer or additional packaging components based on the desired packaging design.

Figure 5:
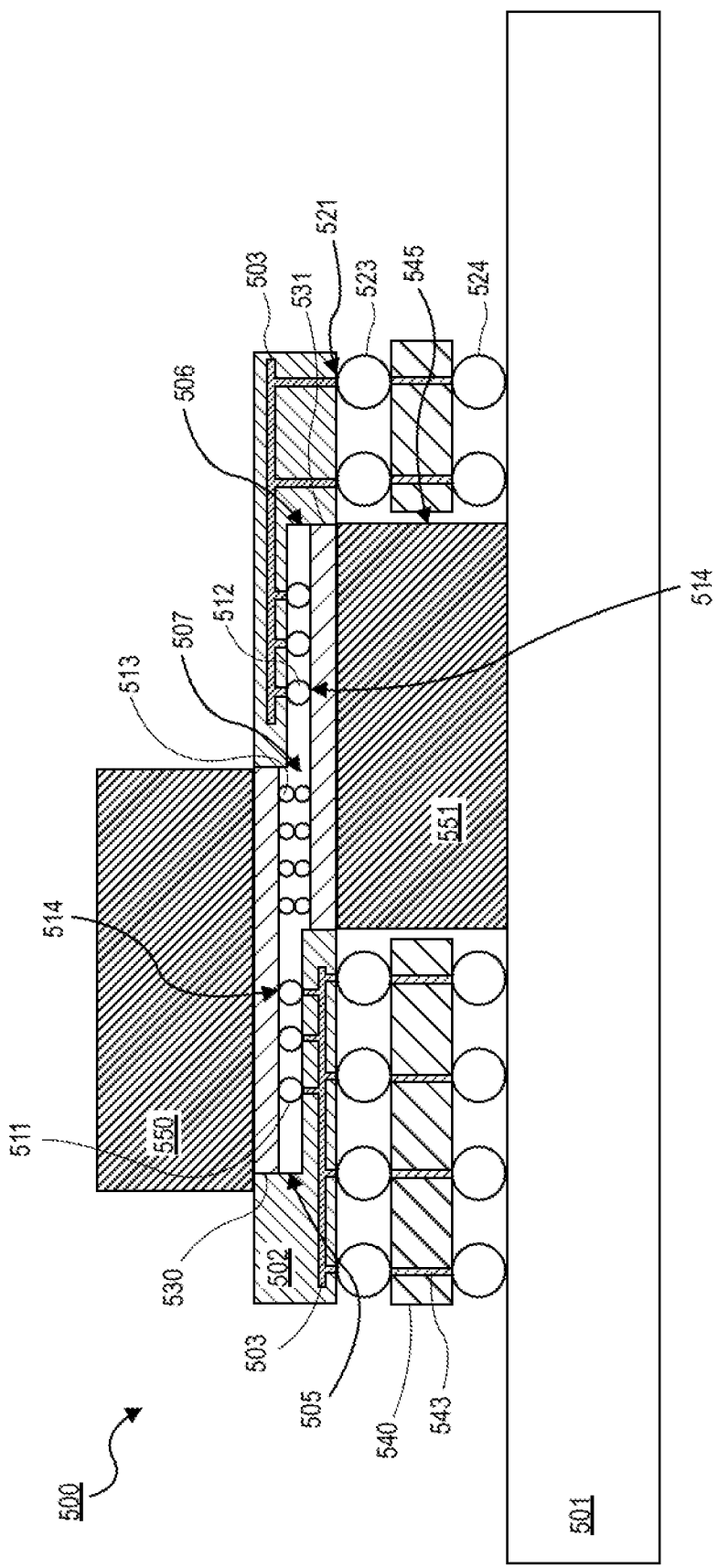
FIG. 5 is an illustration of a cross-sectional view of a semiconductor package with a substrate, an interposer, a plurality of IHSs, a plurality of dies, a direct die-to-die interconnect, and a double-sided package substrate, where the double-side package substrate has a first cavity in a top surface, a second cavity in a bottom surface, and a third cavity in between the first and second cavities, according to one embodiment.

Referring now to FIG. 5, a cross-sectional illustration of a semiconductor package 500 is shown, in accordance with an embodiment. The semiconductor package 500 may be substantially similar to the semiconductor package 400 described above in FIG. 4, with the exception that an interposer 540 with a cavity 545 is disposed (or stacked) between the package substrate 502 and the substrate 501. Whereas the second thermal solution 451 of FIG. 4 has a low-profile thickness that may be accommodated between the package substrate 402 and the substrate 401, and/or the thickness of the second thermal solution 451 of FIG. 4 may be accommodated with the cavity 401a of the substrate 401, the thickness of the second thermal solution 551 of FIG. 5 may be accommodated with the cavity 545 of the interposer 540. As described above, the components of the semiconductor package 500 are substantially similar to the components of the semiconductor package 400 described above in FIG. 4. In particular, the package substrate 502, the cavities 505-507, the solder balls 514, the conductive pads 511-512 and 521, and the conductive lines 503 may be substantially similar to the package substrate 402, the cavities 405-407, the solder balls 414, the conductive pads 411-412 and 421, and the conductive lines 403 described above in FIG. 4.

In one embodiment, the interposer 540 may be a passive stand-off interposer that is added into the stack of the semiconductor package 500 to increase the z-height gap and thus accommodate a larger thermal solution such as the second thermal solution 551. For one embodiment, the interposer 540 may be, but is not limited to, a substrate, a silicon interposer, and/or a die, where each may include through silicon vias (TSVs). As shown in FIG. 5, the interposer 540 may have a plurality of TSVs 543 that may be used to couple the package substrate 502 to the substrate 501, for example, a computer motherboard. For example, the TSVs 543 of the interposer 540 may conductively couple the package substrate 502 with the solder balls 523 to the substrate 501 with the solder balls 524. Additionally, one or more connections between the package substrate 502, the interposer 540, and the substrate 501—e.g., including some or all of bumps 523-524-13 may include one or more interconnect structures and underfill layers. In some embodiments, these interconnect structures (or connections) may variously comprise an alloy of nickel, palladium, and tin (and, in some embodiments, copper).

Connections between the interposer 540 and the substrate 501 may be made using any suitable structure, such as the illustrative solder bumps 524 shown. The interposer 540 may include electronic structures formed thereon or therein, which may be used to couple the package substrate 502 to the substrate 501. For one embodiment, one or more different materials may be used for forming the interposer 540. In certain embodiments, the interposer 540 may be an organic substrate made up of one or more layers of polymer base material, with conducting regions for transmitting signals. In certain embodiments, the interposer 540 may include a ceramic base material including metal regions for transmitting signals.

Additionally, as shown in FIG. 5, the first thermal solution 550 may be disposed over the top surfaces of the first die 530 and/or the package substrate 502, while the second thermal solution 551 may be disposed over the top surface of the second die 531 and/or the bottom surface of the package substrate 502. The first and second thermal solutions 550-551 may be substantially similar to the first and second thermal solution 450-451 described above in FIG. 4. In one embodiment, the second die 531 disposed on the bottom surface of the package substrate 502 may be accommodated with the second thermal solution 551, where the second thermal solution 551 may be a large-profile thermal solution/device such as a heat sink or the like. That is, in one embodiment, the second thermal solution 551 may have a thickness that is accommodated with the opening and thickness of the cavity 545 of the interposer 540, where the interposer 540 has been disposed (or inserted) between the stack of the package substrate 502 and the substrate 501 to provide a larger z-height gap to accommodate the thickness of the second thermal solution 551.

Note that the semiconductor package 500 may include fewer or additional packaging components based on the desired packaging design.

Figure 6:
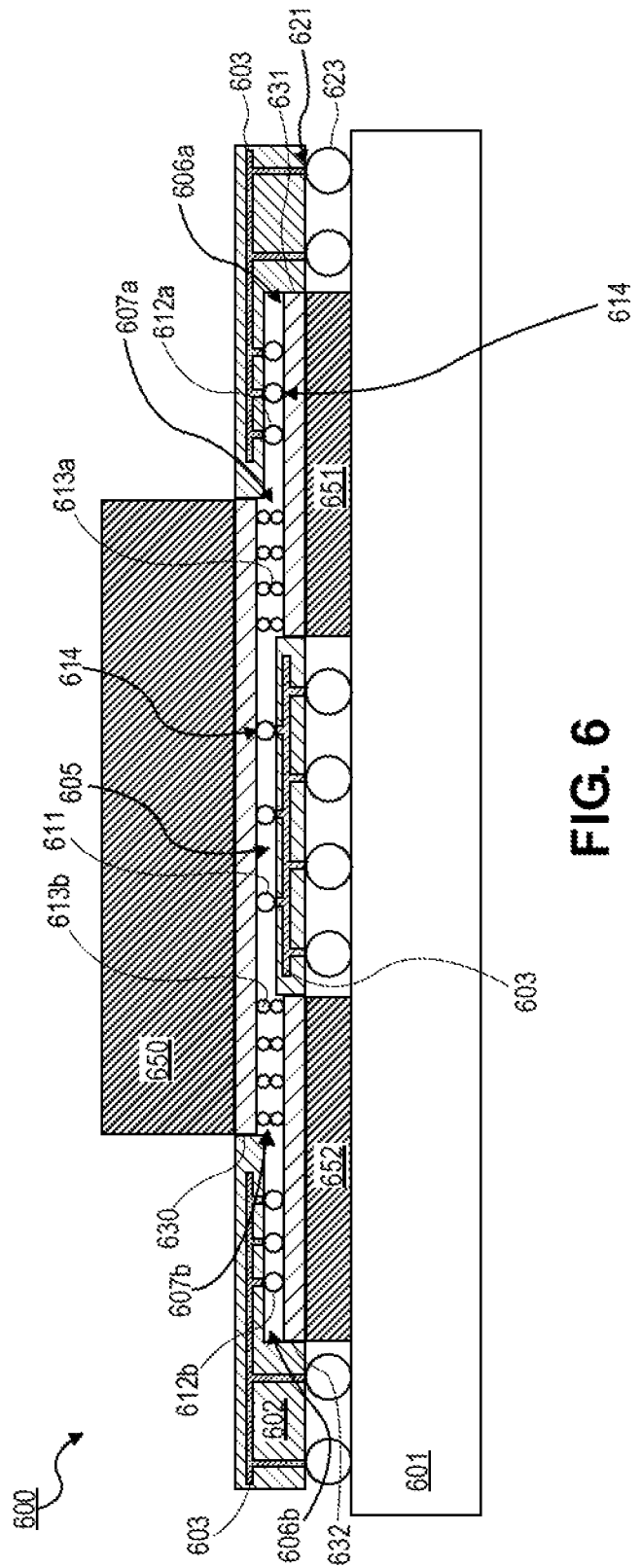
FIG. 6 is an illustration of a cross-sectional view of a semiconductor package with a substrate, a plurality of IHSs, a plurality of dies, a direct die-to-die interconnect, and a double-sided package substrate, where the double-side package substrate has a first cavity in a top surface, a plurality of second cavities in a bottom surface, and a plurality of third cavities in between the first and second cavities, according to one embodiment.

Referring now to FIG. 6, a cross-sectional illustration of a semiconductor package 600 is shown, in accordance with an embodiment. The semiconductor package 600 may be substantially similar to the semiconductor package 400 described above in FIG. 4, with the exception that a three-die 630-632 architecture (or design) with a plurality of cavities 605, 606a-b, and 607a-b is implemented into the package substrate 602, as a first die 630 (or a top die) is, for example, the processor, and a plurality of second and third dies 631-632 (or bottom dies) are, for example, the HBM stacks. Whereas the package substrate 402 of FIG. 4 has one bottom die 431 and one bottom thermal solution 451, the package substrate 602 of FIG. 6 has two bottom dies 631-632 and two bottom thermal solutions 651-652. For example, in one embodiment, the package substrate 602 may include a first cavity 605 in the top surface, a plurality of second cavities 606a-b in the bottom surface, and a plurality of third cavities 607a-b in between the first and second cavities 605 and 606a-b. As described above, the components of the semiconductor package 600 are substantially similar to the components of the semiconductor package 400 described above in FIG. 4. In particular, the package substrate 602, the cavities 605-607, the thermal solutions 650-652, the solder balls 614 and 623, the conductive pads 611, 612a-b and 621, the interconnects 613a-b, the conductive lines 603, and the substrate 601 may be substantially similar to the package substrate 402, the cavities 405-407, the thermal solutions 450-451, the solder balls 414 and 423, the conductive pads 411-412 and 421, the conductive lines 403, and the substrate 401 described above in FIG. 4.

Note that the semiconductor package 600 may include fewer or additional packaging components based on the desired packaging design.

Figure 7:
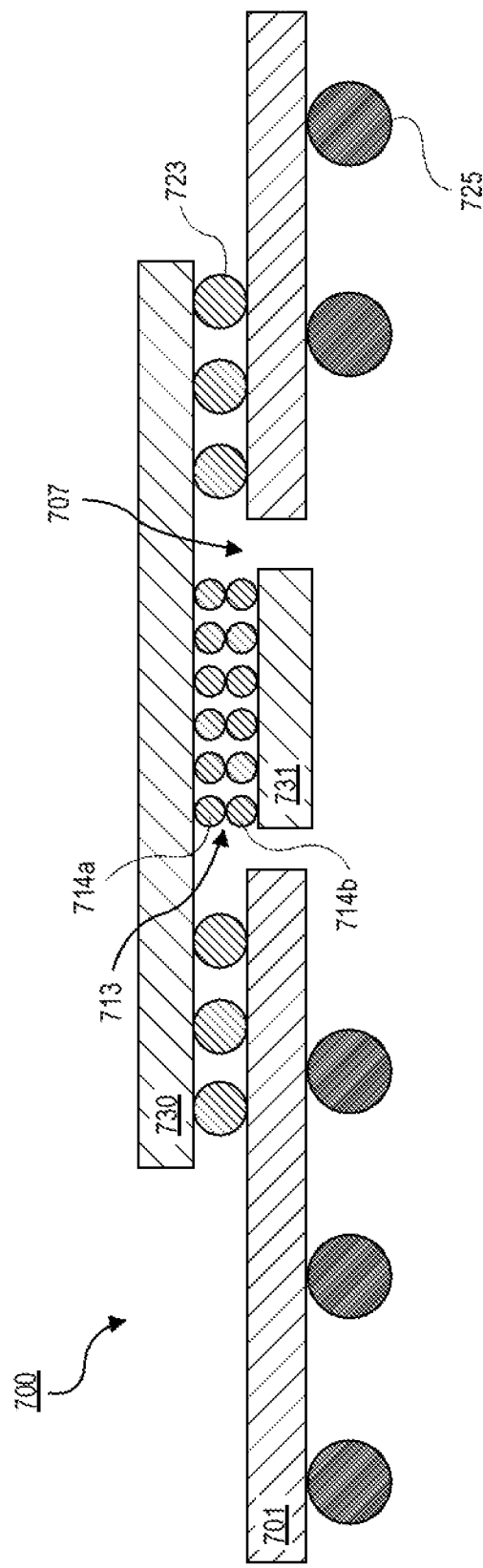
FIG. 7 is an illustration of a cross-sectional view of a semiconductor package with a plurality of dies, a direct die-to-die interconnect, and a substrate with a cavity, according to one embodiment.

Referring now to FIG. 7, a cross-sectional illustration of a semiconductor package 700 is shown, in accordance with an embodiment. The semiconductor package 700 may be substantially similar to the semiconductor package 400 described above in FIG. 4, with the exception that a cavity 707 is patterned into the substrate 701, that the first die 730 and the second die 731 are directly coupled with the interconnect 713, and that the directly coupled second die 731 is disposed into the cavity 707 of the substrate 701 to bypass a package substrate coupled in between the first die 730 and the substrate 701. Whereas the semiconductor package 400 of FIG. 4 has the package substrate 402 with the cavities 405-407, the semiconductor package 700 of FIG. 7 omits the package substrate and instead directly couples the first and second dies 730-731 by embedding (or surrounding) the second die 731 with the cavity 707 of the substrate 701. For example, in one embodiment, the solder balls 714a of the first die 730 are directly coupled with the solder balls 714b of the second die 731 using the die-to-die interconnects 713, while the first die 730 also has the solder balls 723 directly coupled onto the top surface of the substrate 701. In one embodiment, the substrate 701 may further include solder balls 725 to couple the substrate 701 to another substrate (if desired). As described above, the components of the semiconductor package 700 are substantially similar to the components of the semiconductor package 400 described above in FIG. 4. In particular, the dies 730-731, the interconnects 713, and the substrate 701 may be substantially similar to the dies 430-431, the interconnects 413, and the substrate 401 described above in FIG. 4.

Note that the semiconductor package 700 may include fewer or additional packaging components based on the desired packaging design.

Figure 8:
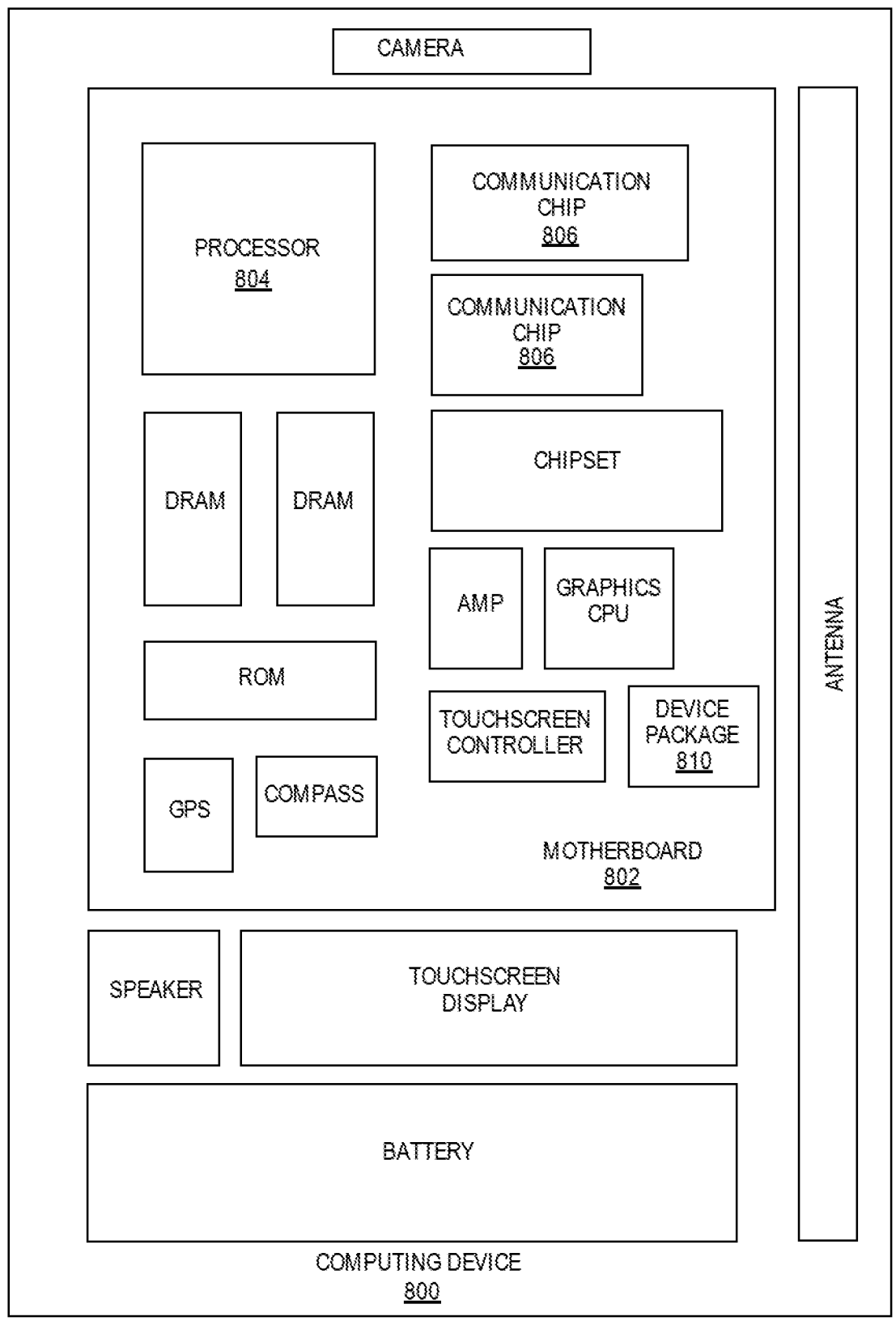
FIG. 8 is an illustration of a schematic block diagram illustrating a computer system that utilizes a semiconductor package with a plurality of dies, a direct die-to-die interconnect, and a double-sided package substrate, where the double-side package substrate has a first cavity in a top surface, a second cavity in a bottom surface, and a third cavity in between the first and second cavities, according to one embodiment.

FIG. 8 is an illustration of a schematic block diagram illustrating a computer system 800 that utilizes a device package 810 (or a semiconductor package) with a plurality of dies, a direct die-to-die interconnect, and a double-sided package substrate, where the double-side package substrate has a first cavity in a top surface, a second cavity in a bottom surface, and a third cavity in between the first and second cavities, according to one embodiment. FIG. 8 illustrates an example of computing device 800. Computing device 800 houses a motherboard 802. Motherboard 802 may include a number of components, including but not limited to processor 804, device package 810 (or semiconductor package), and at least one communication chip 806. Processor 804 is physically and electrically coupled to motherboard 802. For some embodiments, at least one communication chip 806 is also physically and electrically coupled to motherboard 802. For other embodiments, at least one communication chip 806 is part of processor 804.

Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 806 enables wireless communications for the transfer of data to and from computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 806 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

Processor 804 of computing device 800 includes an integrated circuit die packaged within processor 804. Device package 810 may be substantially similar to the semiconductor packages described above in FIGS. 2A-7. Device package 810 may include, but is not limited to, a substrate, an interposer, a package substrate, and/or a PCB. In one embodiment, device package 810 may include a package substrate that may be substantially similar to the package substrates of FIGS. 1A-7 described herein. Device package 810 may include the dies, the direct die-to-die interconnect, and the double-sided package substrate, where the double-side package substrate has a first cavity in a top surface, a second cavity in a bottom surface, and a third cavity in between the first and second cavities, as described herein (e.g., as illustrated and described above with the package substrates with the cavities in FIGS. 1A-7)—or any other components from the figures described herein.

Note that device package 810 may be a single component/device, a subset of components, and/or an entire system, as the materials, features, and components may be limited to device package 810 and/or any other component of the computing device 800 that may need the package substrates with the cavities described herein (e.g., the motherboard 802, the processor 804, and/or any other component of the computing device 800 that may need the embodiments of the package substrates of the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 806 also includes an integrated circuit die packaged within the communication chip 806. For some embodiments, the integrated circuit die of the communication chip 806 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a package substrate, comprising: a first cavity in a top surface; a plurality of first conductive pads on a first surface of the first cavity; a second cavity in a bottom surface; a plurality of second conductive pads on a second surface of the second cavity, wherein the first surface is above the second surface; and a third cavity in the first cavity and the second cavity, wherein the third cavity vertically extends from the top surface to the bottom surface.

In example 2, the subject matter of example 1 can optionally include that the first cavity has a width that is greater than a width of the first surface of the first cavity.

In example 3, the subject matter of examples 1-2 can optionally include that the second cavity has a width that is greater than a width of the second surface of the second cavity.

In example 4, the subject matter of examples 1-3 can optionally include that the third cavity overlaps a first portion of the first cavity and a second portion of the second cavity.

In example 5, the subject matter of examples 1-4 can optionally include that the third cavity has a width that is less than the width of the first cavity and the width of the second cavity.

In example 6, the subject matter of examples 1-5 can optionally include that the width of the third cavity is substantially equal to the first portion of the first cavity and the second portion of the second cavity.

In example 7, the subject matter of examples 1-6 can optionally include a plurality of conductive lines coupled to the plurality of first and second conductive pads; and a plurality of third conductive pads on the bottom surface, wherein the plurality of third conductive pads are conductively coupled to the plurality of conductive lines.

In example 8, the subject matter of examples 1-7 can optionally include a first die in the first cavity, wherein the first die has a plurality of first solder balls, and wherein the plurality of first conductive pads of the first cavity are directly coupled to a first portion of the plurality of first solder balls; a second die in the second cavity, wherein the second die has a plurality of second solder balls, and wherein the plurality of second conductive pads of the second cavity are directly coupled to a first portion of the plurality of second solder balls; and a plurality of interconnects in the third cavity, wherein the plurality of interconnects directly couples a second portion of the plurality of first solder balls of the first die to a second portion of the plurality of second solder balls of the second die.

In example 9, the subject matter of examples 1-8 can optionally include that the plurality of interconnects vertically extend from the bottom surface to the top surface, and wherein the plurality of interconnects vertically extend from a bottom surface of the second die to a bottom surface of the first die.

Example 10 is a semiconductor package, comprising: a package substrate on a substrate, wherein the package substrate is conductively coupled to the substrate with a plurality of third solder balls; a plurality of cavities in the package substrate, wherein the plurality of cavities include a first cavity, a second cavity, and a third cavity, wherein the first cavity is in a top surface of the package substrate, wherein the second cavity is in the bottom surface of the package substrate, wherein the third cavity is in the first cavity and second cavities, and wherein the third cavity vertically extends from the top surface to the bottom surface; a first die in the first cavity of the package substrate; a second die in the second cavity of the package substrate; and a plurality of interconnects in the third cavity of the package substrate, wherein the plurality of interconnects directly couples the first die to the second die within the package substrate, and wherein the plurality of interconnects vertically extend in the third cavity from the bottom surface to the top surface of the package substrate.

In example 11, the subject matter of example 10 can optionally include a first thermal device over a top surface of the first die and the top surface of the package substrate; and a second thermal device over a top surface of the second die and the bottom surface of the package substrate, wherein the second die has a thickness that is less than or equal to a thickness defined from the bottom surface of the package substrate to a top surface of the substrate.

In example 12, the subject matter of examples 10-11 can optionally include that the package substrate has a plurality of first conductive pads on a first surface of the first cavity, wherein the package substrate has a plurality of second conductive pads on a second surface of the second cavity, wherein the first surface of the first cavity is above the second surface of the second cavity, wherein the package substrate has a plurality of conductive lines coupled to the plurality of first and second conductive pads, wherein the package substrate has a plurality of third conductive pads on the bottom surface, wherein the plurality of third conductive pads are conductively coupled to the plurality of conductive lines, and wherein the plurality of third solder balls conductively couple the plurality of third conductive pads of the package substrate to the top surface of the substrate.

In example 13, the subject matter of examples 10-12 can optionally include that the top surface of the first die is substantially coplanar to the top surface of the package substrate, and wherein the top surface of the second die is substantially coplanar to the bottom surface of the package substrate.

In example 14, the subject matter of examples 10-13 can optionally include that the top surface of the first die is above the top surface of the package substrate, or wherein the top surface of the second die is above the bottom surface of the package substrate.

In example 15, the subject matter of examples 10-14 can optionally include that the first die has a plurality of first solder balls, and wherein the plurality of first conductive pads of the first cavity are directly coupled to a first portion of the plurality of first solder balls.

In example 16, the subject matter of examples 10-15 can optionally include that the second die has a plurality of second solder balls, wherein the plurality of second conductive pads of the second cavity are directly coupled to a first portion of the plurality of second solder balls, wherein the plurality of interconnects vertically extend from a bottom surface of the second die to a bottom surface of the first die, and wherein the third cavity of the package substrate has the plurality of interconnects to directly couple a second portion of the plurality of first solder balls of the first die to a second portion of the plurality of second solder balls of the second die.

In example 17, the subject matter of examples 10-16 can optionally include that the first cavity has a width that is greater than a width of the first surface of the first cavity, wherein the second cavity has a width that is greater than a width of the second surface of the second cavity, and wherein the third cavity overlaps a first portion of the first cavity and a second portion of the second cavity.

In example 18, the subject matter of examples 10-17 can optionally include that the third cavity has a width that is less than the width of the first cavity and the width of the second cavity, and wherein the width of the third cavity is substantially equal to the first portion of the first cavity and the second portion of the second cavity.

Example 19 is a semiconductor package, comprising: an interposer on a substrate, wherein the interposer has a plurality of TSVs and a cavity; a package substrate on the interposer, wherein the plurality of TSVs conductively couple the package substrate to the substrate; a plurality of cavities in the package substrate, wherein the plurality of cavities include a first cavity, a second cavity, and a third cavity, wherein the first cavity is in a top surface of the package substrate, wherein the second cavity is in the bottom surface of the package substrate, wherein the third cavity is in the first cavity and second cavities, and wherein the third cavity vertically extends from the top surface to the bottom surface; a first die in the first cavity of the package substrate; a second die in the second cavity of the package substrate; a plurality of interconnects in the third cavity of the package substrate, wherein the plurality of interconnects directly couples the first die to the second die within the package substrate, and wherein the plurality of interconnects vertically extend in the third cavity from the bottom surface to the top surface of the package substrate; a first thermal device over a top surface of the first die and the top surface of the package substrate; and a second thermal device over a top surface of the second die and the bottom surface of the package substrate, wherein the second thermal device vertically extends through the cavity of the interposer.

In example 20, the subject matter of example 19 can optionally include that the package substrate has a plurality of first conductive pads on a first surface of the first cavity, wherein the package substrate has a plurality of second conductive pads on a second surface of the second cavity, wherein the first surface of the first cavity is above the second surface of the second cavity, wherein the package substrate has a plurality of conductive lines coupled to the plurality of first and second conductive pads, wherein the package substrate has a plurality of third conductive pads on the bottom surface, wherein the plurality of third conductive pads are conductively coupled to the plurality of conductive lines, and wherein the plurality of third solder balls conductively couple the plurality of third conductive pads of the package substrate to the top surface of the substrate.

In example 21, the subject matter of examples 19-20 can optionally include that the top surface of the first die is substantially coplanar to the top surface of the package substrate, and wherein the top surface of the second die is substantially coplanar to the bottom surface of the package substrate.

In example 22, the subject matter of examples 19-21 can optionally include that the top surface of the first die is above the top surface of the package substrate, or wherein the top surface of the second die is above the bottom surface of the package substrate.

In example 23, the subject matter of examples 19-22 can optionally include that the first die has a plurality of first solder balls, wherein the plurality of first conductive pads of the first cavity are directly coupled to a first portion of the plurality of first solder balls, wherein the package substrate is conductively coupled to the interposer with a plurality of third solder balls, wherein the interposer is conductively coupled to the substrate with a plurality of fourth solder balls, and wherein the plurality of TSVs of the interposer conductively couples the plurality of third solder balls to the plurality of fourth solder balls.

In example 24, the subject matter of examples 19-23 can optionally include that the second die has a plurality of second solder balls, wherein the plurality of second conductive pads of the second cavity are directly coupled to a first portion of the plurality of second solder balls, wherein the plurality of interconnects vertically extend from a bottom surface of the second die to a bottom surface of the first die, and wherein the third cavity of the package substrate has the plurality of interconnects to directly couple a second portion of the plurality of first solder balls of the first die to a second portion of the plurality of second solder balls of the second die.

In example 25, the subject matter of examples 19-24 can optionally include that the first cavity has a width that is greater than a width of the first surface of the first cavity, wherein the second cavity has a width that is greater than a width of the second surface of the second cavity, wherein the third cavity overlaps a first portion of the first cavity and a second portion of the second cavity, wherein the third cavity has a width that is less than the width of the first cavity and the width of the second cavity, and wherein the width of the third cavity is substantially equal to the first portion of the first cavity and the second portion of the second cavity.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
   a first cavity in a top surface of the package substrate;
   a plurality of first conductive pads on a first surface of the first cavity of the package substrate;
   a second cavity in a bottom surface of the package substrate;
   a plurality of second conductive pads on a second surface of the second cavity of the package substrate; and
   a third cavity in the first cavity and the second cavity of the package substrate, wherein the third cavity vertically extends from the top surface to the bottom surface of the package substrate.

2. The package substrate of claim 1, wherein the first cavity has a width that is greater than a width of the first surface of the first cavity.

3. The package substrate of claim 2, wherein the second cavity has a width that is greater than a width of the second surface of the second cavity.

4. The package substrate of claim 3, wherein the third cavity overlaps a first portion of the first cavity and a second portion of the second cavity.

5. The package substrate of claim 4, wherein the third cavity has a width that is less than the width of the first cavity and the width of the second cavity.

6. The package substrate of claim 5, wherein the width of the third cavity is substantially equal to the first portion of the first cavity and the second portion of the second cavity.

7. The package substrate of claim 1, further comprising:
a plurality of conductive lines coupled to the plurality of first and second conductive pads; and
a plurality of third conductive pads on the bottom surface, wherein the plurality of third conductive pads are conductively coupled to the plurality of conductive lines.

8. The package substrate of claim 1, further comprising:
a first die in the first cavity, wherein the first die has a plurality of first solder balls, and wherein the plurality of first conductive pads of the first cavity are directly coupled to a first portion of the plurality of first solder balls;
a second die in the second cavity, wherein the second die has a plurality of second solder balls, and wherein the plurality of second conductive pads of the second cavity are directly coupled to a first portion of the plurality of second solder balls; and
a plurality of interconnects in the third cavity, wherein the plurality of interconnects directly couples a second portion of the plurality of first solder balls of the first die to a second portion of the plurality of second solder balls of the second die.

9. The package substrate of claim 8, wherein the plurality of interconnects vertically extend from the bottom surface to the top surface, and wherein the plurality of interconnects vertically extend from a bottom surface of the second die to a bottom surface of the first die.

10. A semiconductor package, comprising:
a package substrate on a substrate, wherein the package substrate is conductively coupled to the substrate with a plurality of third solder balls;
a plurality of cavities in the package substrate, wherein the plurality of cavities include a first cavity of the package substrate, a second cavity of the package substrate, and a third cavity of the package substrate, wherein the first cavity is in a top surface of the package substrate, wherein the second cavity is in the bottom surface of the package substrate, wherein the third cavity is in the first cavity and second cavities of the package substrate, and wherein the third cavity vertically extends from the top surface to the bottom surface of the package substrate;
a first die in the first cavity of the package substrate;
a second die in the second cavity of the package substrate; and
a plurality of interconnects in the third cavity of the package substrate, wherein the plurality of interconnects directly couples the first die to the second die within the package substrate, and wherein the plurality of interconnects vertically extend in the third cavity from the bottom surface to the top surface of the package substrate.

11. The semiconductor package of claim 10, further comprising:
a first thermal device over a top surface of the first die and the top surface of the package substrate; and
a second thermal device over a top surface of the second die and the bottom surface of the package substrate, wherein the second die has a thickness that is less than or equal to a thickness defined from the bottom surface of the package substrate to a top surface of the substrate.

12. The semiconductor package of claim 11, wherein the package substrate has a plurality of first conductive pads on a first surface of the first cavity, wherein the package substrate has a plurality of second conductive pads on a second surface of the second cavity, wherein the first surface of the first cavity is above the second surface of the second cavity, wherein the package substrate has a plurality of conductive lines coupled to the plurality of first and second conductive pads, wherein the package substrate has a plurality of third conductive pads on the bottom surface, wherein the plurality of third conductive pads are conductively coupled to the plurality of conductive lines, and wherein the plurality of third solder balls conductively couple the plurality of third conductive pads of the package substrate to the top surface of the substrate.

13. The semiconductor package of claim 11, wherein the top surface of the first die is substantially coplanar to the top surface of the package substrate, and wherein the top surface of the second die is substantially coplanar to the bottom surface of the package substrate.

14. The semiconductor package of claim 11, wherein the top surface of the first die is above the top surface of the package substrate, or wherein the top surface of the second die is above the bottom surface of the package substrate.

15. The semiconductor package of claim 10, wherein the first die has a plurality of first solder balls, and wherein the plurality of first conductive pads of the first cavity are directly coupled to a first portion of the plurality of first solder balls.

16. The semiconductor package of claim 14, wherein the second die has a plurality of second solder balls, wherein the plurality of second conductive pads of the second cavity are directly coupled to a first portion of the plurality of second solder balls, wherein the plurality of interconnects vertically extend from a bottom surface of the second die to a bottom surface of the first die, and wherein the third cavity of the package substrate has the plurality of interconnects to directly couple a second portion of the plurality of first solder balls of the first die to a second portion of the plurality of second solder balls of the second die.

17. The semiconductor package of claim 12, wherein the first cavity has a width that is greater than a width of the first surface of the first cavity, wherein the second cavity has a width that is greater than a width of the second surface of the second cavity, and wherein the third cavity overlaps a first portion of the first cavity and a second portion of the second cavity.

18. The semiconductor package of claim 17, wherein the third cavity has a width that is less than the width of the first cavity and the width of the second cavity, and wherein the width of the third cavity is substantially equal to the first portion of the first cavity and the second portion of the second cavity.

19. A semiconductor package, comprising:
an interposer on a substrate, wherein the interposer has a plurality of through silicon vias (TSVs) and a cavity;
a package substrate on the interposer, wherein the plurality of TSVs conductively couple the package substrate to the substrate;
a plurality of cavities in the package substrate, wherein the plurality of cavities include a first cavity of the package substrate, a second cavity of the package substrate, and a third cavity of the package substrate, wherein the first cavity is in a top surface of the package substrate, wherein the second cavity is in the bottom surface of the package substrate, wherein the third cavity is in the first cavity and second cavities of the package substrate, and wherein the third cavity vertically extends from the top surface to the bottom surface of the package substrate;

a first die in the first cavity of the package substrate;

a second die in the second cavity of the package substrate;

a plurality of interconnects in the third cavity of the package substrate, wherein the plurality of interconnects directly couples the first die to the second die within the package substrate, and wherein the plurality of interconnects vertically extend in the third cavity from the bottom surface to the top surface of the package substrate;

a first thermal device over a top surface of the first die and the top surface of the package substrate; and a second thermal device over a top surface of the second die and the bottom surface of the package substrate, wherein the second thermal device vertically extends through the cavity of the interposer.

20. The semiconductor package of claim 19, wherein the package substrate has a plurality of first conductive pads on a first surface of the first cavity, wherein the package substrate has a plurality of second conductive pads on a second surface of the second cavity, wherein the first surface of the first cavity is above the second surface of the second cavity, wherein the package substrate has a plurality of conductive lines coupled to the plurality of first and second conductive pads, wherein the package substrate has a plurality of third conductive pads on the bottom surface, wherein the plurality of third conductive pads are conductively coupled to the plurality of conductive lines, and wherein the plurality of third solder balls conductively couple the plurality of third conductive pads of the package substrate to the top surface of the substrate.

21. The semiconductor package of claim 19, wherein the top surface of the first die is substantially coplanar to the top surface of the package substrate, and wherein the top surface of the second die is substantially coplanar to the bottom surface of the package substrate.

22. The semiconductor package of claim 19, wherein the top surface of the first die is above the top surface of the package substrate, or wherein the top surface of the second die is above the bottom surface of the package substrate.

23. The semiconductor package of claim 19, wherein the first die has a plurality of first solder balls, wherein the plurality of first conductive pads of the first cavity are directly coupled to a first portion of the plurality of first solder balls, wherein the package substrate is conductively coupled to the interposer with a plurality of third solder balls, wherein the interposer is conductively coupled to the substrate with a plurality of fourth solder balls, and wherein the plurality of TSVs of the interposer conductively couples the plurality of third solder balls to the plurality of fourth solder balls.

24. The semiconductor package of claim 19, wherein the second die has a plurality of second solder balls, wherein the plurality of second conductive pads of the second cavity are directly coupled to a first portion of the plurality of second solder balls, wherein the plurality of interconnects vertically extend from a bottom surface of the second die to a bottom surface of the first die, and wherein the third cavity of the package substrate has the plurality of interconnects to directly couple a second portion of the plurality of first solder balls of the first die to a second portion of the plurality of second solder balls of the second die.

25. The semiconductor package of claim 20, wherein the first cavity has a width that is greater than a width of the first surface of the first cavity, wherein the second cavity has a width that is greater than a width of the second surface of the second cavity, wherein the third cavity overlaps a first portion of the first cavity and a second portion of the second cavity, wherein the third cavity has a width that is less than the width of the first cavity and the width of the second cavity, and wherein the width of the third cavity is substantially equal to the first portion of the first cavity and the second portion of the second cavity.

\* \* \* \* \*